United States Patent
Hasunuma

(10) Patent No.: US 7,723,184 B2
(45) Date of Patent: May 25, 2010

(54) SEMICONDUCTOR DEVICE AND MANUFACTURE METHOD THEREFOR

(75) Inventor: Eiji Hasunuma, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 175 days.

(21) Appl. No.: 11/984,794

(22) Filed: Nov. 21, 2007

(65) Prior Publication Data

US 2008/0121990 A1 May 29, 2008

(30) Foreign Application Priority Data

Nov. 27, 2006 (JP) .............................. 2006-318726

(51) Int. Cl.
*H01L 21/336* (2006.01)
(52) U.S. Cl. ............................... 438/259; 257/E21.384
(58) Field of Classification Search ................. 438/257, 438/259, 297, 302, 303; 257/E21.384, E21.428
See application file for complete search history.

(56) References Cited

U.S. PATENT DOCUMENTS

| | | | |
|---|---|---|---|
| 5,142,640 A | 8/1992 | Iwamatsu | |
| 6,476,444 B1* | 11/2002 | Min | ............................ 257/330 |
| 6,717,200 B1 | 4/2004 | Schamberger et al. | |
| 6,852,597 B2* | 2/2005 | Park et al. | .................... 438/268 |
| 7,541,244 B2* | 6/2009 | Lin et al. | ..................... 438/270 |
| 2005/0020086 A1 | 1/2005 | Kim et al. | |
| 2005/0045944 A1* | 3/2005 | Gratz et al. | .................. 257/330 |
| 2005/0112839 A1* | 5/2005 | Wu | ............................. 438/389 |
| 2007/0090452 A1* | 4/2007 | Cho et al. | ..................... 257/330 |
| 2008/0048230 A1* | 2/2008 | Yamazaki | ..................... 257/300 |

FOREIGN PATENT DOCUMENTS

| | | |
|---|---|---|
| JP | 2-23670 A | 1/1990 |
| JP | 6-13621 | 1/1994 |
| JP | 9-74132 A | 3/1997 |
| JP | 2000-114512 A | 4/2000 |
| JP | 2005-45198 A | 2/2005 |

OTHER PUBLICATIONS

Japanese Office Action dated Mar. 24, 2009 with English-Language Translation.

* cited by examiner

*Primary Examiner*—W. David Coleman
(74) *Attorney, Agent, or Firm*—McGinn IP Law Group, PLLC

(57) ABSTRACT

A semiconductor device is provided which is suitable for a DRAM with word lines and configured to have a trench gate transistor and suppress an increase in the capacitance of a word line without affecting the transistor characteristics. The semiconductor device includes a trench gate transistor which is provided with: a trench which is provided with vertical sides and is formed in a semiconductor substrate; a gate electrode which is formed inside the trench via a gate dielectric film; and a source and a drain which are provided at the semiconductor substrate in the vicinity of the gate electrode via the gate dielectric film, wherein at least one of the thickness of the gate dielectric film in a region contacting the source and the thickness of the gate dielectric film in a region contacting the drain are larger than the thickness of the gate dielectric film formed inside the trench.

8 Claims, 7 Drawing Sheets

SEMICONDUCTOR DEVICE AND MANUFACTURE METHOD THEREFOR

BACKGROUND OF THE INVENTION

1. Field of the Invention

The present invention relates to a semiconductor device having a trench gate and a manufacture method therefor.

Priority is claimed on Japanese Patent Application No. 2006-318726 filed on Nov. 27, 2006, the contents of which are incorporated herein by reference.

2. Description of the Related Art

Each memory cell in a DRAM (Dynamic Random Access Memory) or the like includes a selection transistor and a capacitor. The microfabrication of semiconductor elements leads to size reduction of MOS (Metal Oxide Semiconductor) transistors, which makes the short channel effect of MOS transistors prominent. In a large-capacity DRAM, the size reduction of the memory cells makes the channel length of transfer gate transistors shorter, thus reducing the performance of the transfer gate transistors. This brings about problems of impairing the retention and writing characteristics of the DRAM memory cells. In the following description, the "transfer gate transistor" is described as "memory cell transistor".

As one way of dealing with the short channel of transistors, trench gate transistors having a channel with a three-dimensional structure have been developed. This trench gate transistor has a trench formed in a semiconductor substrate and makes the channel length longer by effectively using a three-dimensional trench interface as a channel. One example of the configuration of a DRAM using such a trench gate transistor (also called as RCAT (Recess Channel Access Transistor)) will be described below referring to FIGS. 15 and 16. FIG. 15 is a conceptual diagram showing the planar structure of a memory cell, and FIG. 16 is a conceptual diagram of the cross section of the memory cell along line A-A' shown in FIG. 15.

A memory cell section 101 shown in FIG. 15 is one example of a structure where 2-bit memory cells are laid out in a single active region.

The memory cell section 101 is roughly structured by arraying a plurality of elongated active regions 102, slightly skewed in a planar view in FIG. 15, in a corresponding area of a semiconductor substrate, at predetermined intervals in a horizontal (X) direction and a vertical (Y) direction, providing a bit line contact (not shown) at a center portion of each active region 102, and providing a memory cell transistor (not shown) and a capacitor (not shown) connected to a substrate contact 105 on both right and left sides of the bit line contact. In the illustrated structure, multiple memory cells are repeatedly laid out in a matrix form with a plurality of serpentine bit lines 106, laid out in the horizontal (X) direction, and a plurality of word lines (including gate electrodes) 107, laid out in the vertical (Y) direction, as common interconnection lines. A selective epitaxial layer 103 is formed on those surface regions of the semiconductor substrate which become a source and a drain, and LDD (Lightly Doped Drain) side walls 108 are formed on side walls of the word line 107.

The cross-sectional structure of the memory cell section shown in FIG. 16 has a trench isolation dielectric film 110, a trench 111, a gate oxide film 112, a gate electrode 113, a first conductive layer 114 provided inside a substrate contact, a lightly doped impurity diffusion layer 115, a heavily doped impurity diffusion layer 116, a dielectric layer mask 117 provided on a gate electrode, a second conductive layer 119 provided in the substrate contact, an oxide film 120 provided on side walls of the gate electrode, and the LDD side walls 108.

The following patent document is known as a prior art document relating to such a trench gate transistor.

Japanese Unexamined Patent Application, First Publication No. H6-13621 discloses the structure of a trench gate MOS-FET (Field Effect Transistor) where to improve the breakdown voltage by relaxing the concentration of an electric field at that portion of an N-drift layer 2 which lies near a gate electrode 5, a first gate dielectric film 6a, located between the gate electrode 5 and the N-drift layer 2, is made thinner than a second gate dielectric film 6b, located between the gate electrode 5 and that portion of a well region 3 where a channel is to be formed, so that when a reverse bias is applied to the gate electrode 5, the conductivity type of the portion of the N-drift layer 2 which lies near the gate electrode 5 is inverted to a P type.

While the trench gate transistor with the structure typified by the one shown in FIGS. 15 and 16 is advantageous over a planar transistor in that the gate length can be made longer at shorter gate pitches, it has a problem of having a large gate capacitance.

In a planar transistor, gate electrodes are positioned only on a semiconductor substrate and the side of a gate electrode that faces diffusion layers where a source and a drain are to be formed is limited to a two-dimensionally overlapping region at the surface of the semiconductor substrate. In a transistor with a trench gate structure, by way of contrast, diffusion layers are in contact not only with the surface of the semiconductor substrate but also upper side walls in a trench, increasing the area of the overlapping region of the gate electrode and the diffusion layers. This increases the gate capacitance. The overlapping region becomes a gate electrode or a parasitic capacitor of a word line in the DRAM, and therefore causes an operational delay, which impedes a fast operation.

It is therefore desirable that the conventional trench gate transistor should have such a structure as to be able to reduce the gate capacitance.

For example, while a DRAM having a trench gate transistor which can ensure microfabrication of the circuit of the memory cell section by reducing the gate length has an advantage of improving the refresh characteristics, the DRAM faces the problem of an increase in power consumption caused as the value of the current needed to write data increases due to the increased gate capacitance.

SUMMARY OF THE INVENTION

The present invention has been made in view of the foregoing circumstances, and it is an object of the present invention to provide a semiconductor device suitable for a DRAM with word lines and configured to have a trench gate transistor and suppress an increase in the capacitance of a word line without affecting the transistor characteristics, and a manufacture method therefor.

A semiconductor device of the present invention comprises a trench gate transistor, the trench gate transistor comprising: a trench which is provided with vertical sides and is formed in a semiconductor substrate; a gate electrode which is formed inside the trench via a gate dielectric film; and a source and a drain which are provided at the semiconductor substrate in the vicinity of the gate electrode via the gate dielectric film, wherein at least one of the thickness of the gate dielectric film in a region contacting the source and the thickness of the gate dielectric film in a region contacting the drain are larger than the thickness of the gate dielectric film formed inside the trench.

Preferably, in the semiconductor device, the source and the drain are formed at a surface region of the semiconductor device at positions facing each other with the trench in between, the gate dielectric film is formed at an inner surface of the trench from the region contacting the source to the region contacting the drain along the inner surface of the trench, the gate electrode is formed in such a way as to bury an interior of another trench inward of the gate dielectric film, and the thickness of the gate dielectric film in the region contacting the source and the thickness of the gate dielectric film in the region contacting the drain, which are respectively positioned on both sides of the gate electrode, are larger than the thickness of the gate dielectric film formed inside the trench.

Preferably, in the semiconductor device, the gate dielectric film positioned between the source and the gate electrode and the gate dielectric film positioned between the drain and the gate electrode form thick film parts, and the gate dielectric film formed at the inner surface of the trench apart from the source and the drain forms a thin film part having a uniform thickness.

Preferably, in the semiconductor device, a surface dielectric film is formed in such a way as to cover the source and the drain on a surface side of the semiconductor substrate, and the surface dielectric film is connected to the gate dielectric film inside the trench and to a thick film part of the gate dielectric film in which the thickness of the gate dielectric film is larger than the thickness of the gate dielectric film formed inside the trench.

A method of manufacturing a semiconductor device of the present invention comprises: forming an element isolation dielectric film in a semiconductor substrate; forming a dielectric film and a nitride film on the semiconductor substrate in which the element isolation dielectric film is formed; forming a trench with vertical sides in the semiconductor substrate with the nitride film used as a mask; forming an oxidation accelerating portion by implanting ions in a surface portion of the semiconductor substrate at a periphery of the trench; forming a gate oxide film inside the trench by oxidizing a region of the semiconductor substrate inside the trench by oxidation, and forming a thick film part, which is thicker than the gate oxide film inside the trench, at the oxidation accelerating portion; forming a gate electrode in another trench inward of the gate oxide film; and forming a source and a drain by implanting ions in the semiconductor substrate adjacent to the gate electrode.

Preferably, in the method, at the time of implanting the ions in the surface portion of the semiconductor substrate at the periphery of the trench, the ions are implanted in a tilted manner with respect to the depth direction of the trench, and the oxidation accelerating portion is formed in the surface portion of the semiconductor substrate at a periphery of an inlet portion of the trench.

Preferably, in the method, the oxidation accelerating portion forms a part of the source and the drain.

Preferably, in the method, implantation of the ions into the surface portion of the semiconductor substrate at the periphery of the trench turns an ion-implanted portion into amorphous silicon.

Preferably, in the method, the ions to be implanted to form the oxidation accelerating portion have the same conductivity type as that of the ions for forming the source and the drain.

Preferably, in the method, an amount of implantation of the ions to be implanted into the surface portion of the semiconductor substrate at the periphery of the trench is set to $5 \times 10^{15}$ to $5 \times 10^{16}$ atoms/cm$^2$.

Preferably, in the method, the ion implantation angle at the time of implanting the ions is defined as a tilt angle theta with respect to the depth direction of the trench, and the tilt angle theta is set to the range of $\tan^{-1}\{c/(a+b)\} < $ theta $ < \tan^{-1}(c/b)$ where a is the depth of a region to be the source and the drain, b is the thickness of the nitride film, and c is the width of the trench.

Preferably, in the method, the ions to be implanted to form the oxidation accelerating portion have an accelerating oxidation characteristic.

As described above, the configuration of the present invention can overcome the problem that in the structure of a trench gate transistor microfabricated by shortening the distance between the drain and source, the capacitance of the trench gate transistor with the conventional structure, i.e., the parasitic capacitance of a word line when the transistor is adapted to a DRAM, is increased inevitably, thereby overcoming the problem of signal delay and the problem of the delay in the operational speed originated from signal delay.

Moreover, as a thick film portion of a gate dielectric film is formed between a gate electrode and a source and between the gate electrode and a drain, and the gate dielectric film on that portion of the interior side of a trench which is located apart from the source and drain is made thin in the present invention, an increase in capacitance can be suppressed without particularly affecting the characteristics of the transistor.

DETAILED DESCRIPTION OF THE INVENTION

While semiconductor devices in accordance with one embodiment of the present invention will now be described with reference to the accompanying drawings, the present invention is not limited to the embodiment to be described below.

Figure 1:
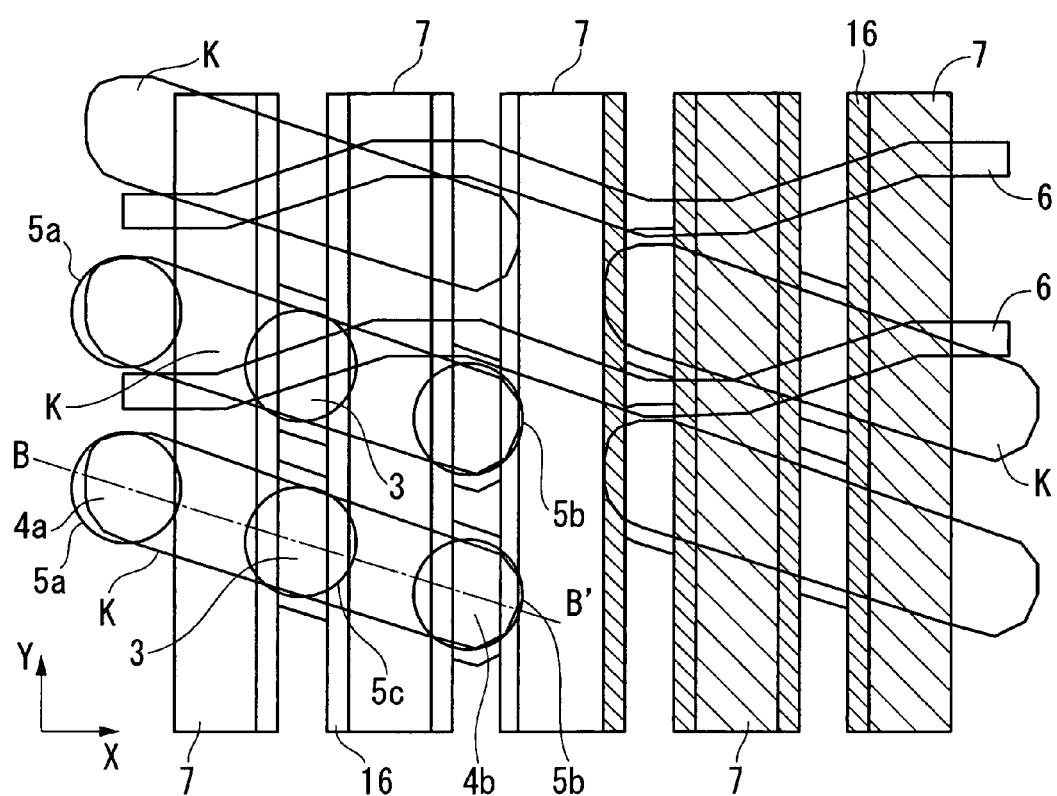
FIG. 1 is a conceptual diagram showing the planar structure of a semiconductor device in accordance with a first embodiment of the present invention.
Figure 2:
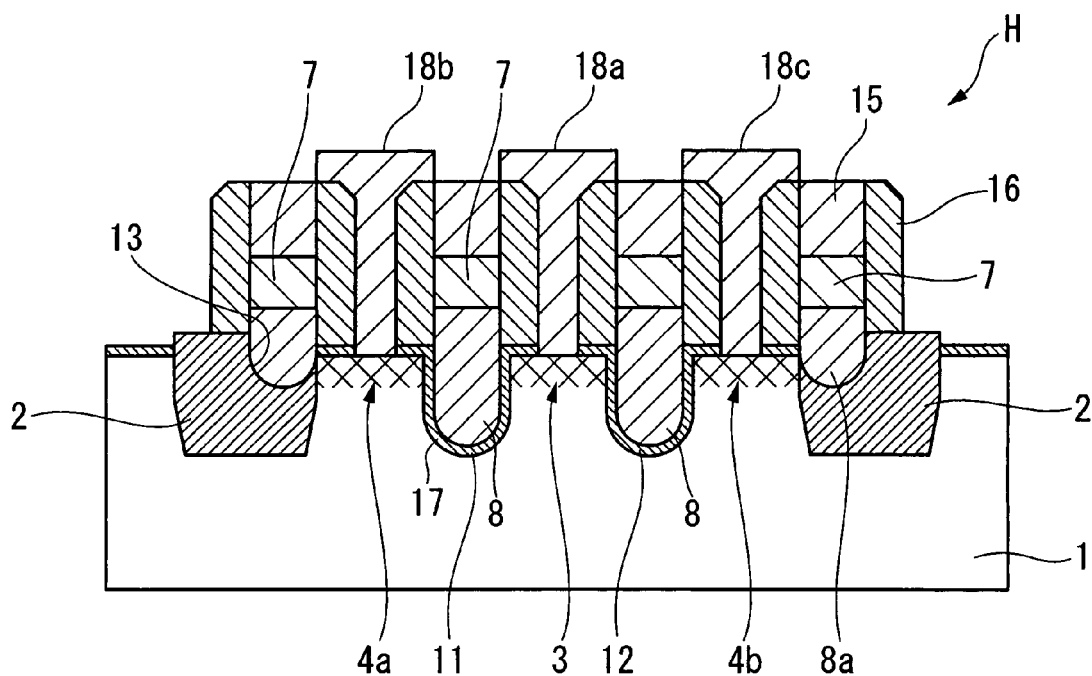
FIG. 2 is a conceptual diagram of a partial cross section of the semiconductor device in accordance with the first embodiment of the invention.

FIG. 1 is a conceptual diagram showing the planar structure of a semiconductor device in accordance with a first embodiment of the present invention, and FIG. 2 is a conceptual diagram of the cross section of the semiconductor device along line B-B' shown in FIG. 1.

In these diagrams, a semiconductor substrate 1 which is to be adapted to a semiconductor device H in accordance with the first embodiment is formed of a semiconductor, such as silicon, containing an impurity with a predetermined concentration.

A trench isolation dielectric film (element isolating dielectric film) 2 is formed on the top surface of the semiconductor substrate 1 at a portion other than active regions K by an STI (Shallow Trench Isolation) method to insulate and isolate adjoining active regions K. The present embodiment has one example of the configuration of the present invention as adapted to a cell structure having 2-bit memory cells laid out in one active region K.

In the configuration of the present embodiment, as apparent from the planar structure shown in FIG. 1, a plurality of thin, elongated strip active regions K are aligned at predetermined intervals, with an impurity diffusion layer provided at each of both end portions and a center portion of each active region K. In the present embodiment, a drain 3 is formed at the center portion, sources 4a and 4b are respectively formed at both end portions, and substrate contacts 5c, 5a, and 5b are provided directly above the drain 3 and the sources 4a and 4b.

While the planar active region K as illustrated in FIG. 1 is a unique shape of the present embodiment, the shape and direction of the active region K are not to be particularly defined, so that the shape of the active region K shown in FIG. 1 can of course take the shape of an active region adapted to an ordinary trench gate transistor and is not limited to the shape of the present embodiment.

A plurality of bit lines 6 each extending in a serpentine manner in a horizontal (X) direction in FIG. 1 are provided in a vertical (Y) direction in FIG. 1 at predetermined intervals. A plurality of straight word lines 7 each extending in the vertical (Y) direction in FIG. 1 are provided in the horizontal (X) direction in FIG. 1 at predetermined intervals. Each word line 7 is formed in such a way as to overlap with a gate electrode 8 shown in FIG. 2 at an intersection with each active region K.

As apparent from the cross-sectional configuration shown in FIG. 2, in the semiconductor substrate 1, the source 4a, the drain 3, and the source 4b are formed apart from one another at the active regions K defined by the trench isolation dielectric film 2, a trench 11 is formed between the source 4a and the drain 3 by trenching the semiconductor substrate 1, a trench 12 is formed between the drain 3 and the source 4b by trenching the semiconductor substrate 1, and trenches 13 are formed in those portions of the trench isolation dielectric film 2 which are located on both sides of the trenches 11 and 12.

The trenches 11 and 12 are formed consecutively along the word line 7. The trench 11 is so formed as to be positioned between the source 4a and the drain 3, and the trench 12 is so formed as to be positioned between the drain 3 and the source 4b.

In the trench gate type transistor structure of the present embodiment, the inner wall portions of the trenches are formed in accordance with the positional relationships between the drain 3 and the sources 4a and 4b and the channel shape, and therefore are not limited to the illustrated shapes.

A gate dielectric film 17 is formed on the inner wall of the trenches 11 and 12 up to the peripheral portion of each trench on the semiconductor substrate 1. The gate electrode 8 is formed in each of the trenches 11 and 12 and projecting thereabove in such a way as to be in contact with each gate dielectric film 17. The word line 7 and a dielectric-film hard mask 15 are formed in lamination on each gate electrode 8. LDD side walls 16 are formed: on both sides of an upper portion of the gate electrode 8 projecting upward from the semiconductor substrate 1; on both sides of a portion of the word line 7 located on the top surface of the gate electrode 8; and on both sides of the dielectric-film hard mask 15 located on the top surface of the word line 7. A gate electrode material 8a is formed inside each trench 13 formed in the trench isolation dielectric film 2, and the word line 7 and the dielectric-film hard mask 15 are formed in lamination on the gate electrode material 8a.

Figure 3:
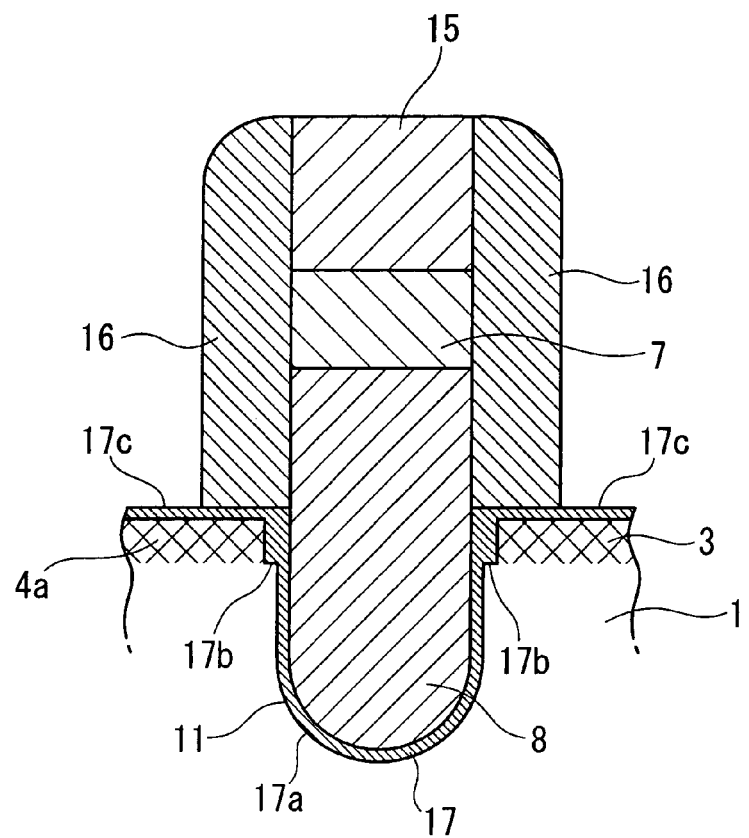
FIG. 3 is a conceptual diagram of the cross section of a transistor portion of the semiconductor device.

FIG. 3 is a schematic diagram of the cross section showing the trench portion in enlargement. The gate dielectric film 17 formed in the trench 11 or 12 has a thin film part 17a formed inside the trench 11 or 12 with an approximately uniform thickness, a thick film part 17b formed at the inner peripheral portion of the opening of the trench 11 or 12 in such a way as to be continuous to the thin film part 17a, and a cover part 17c formed at the outer peripheral portion of the opening of the trench 11 or 12 up to the top surface side of the semiconductor substrate 1 in such a way as to be continuous to the thick film part 17b. The thickness of the cover part 17c is made equal to the thickness of the thin film part 17a.

The gate dielectric film 17 in the configuration of the present embodiment is formed by, for example, thermal oxidation of silicon of the semiconductor substrate 1. The thick film part 17b is made thicker than the other portions by implanting silicon ions into the semiconductor substrate 1, making the implanted portion amorphous to increase the oxidation rate, and further performing thermal oxidation.

In FIG. 2, conductor parts 18a, 18b, and 18c for substrate contacts are respectively formed on the drain 3 and the sources 4a and 4b to form substrate contacts 5a, 5b, and 5c shown in FIG. 1 which ensure connection to capacitor structures of a DRAM to be described later to which the semiconductor device with the configuration of the present invention is adapted.

In the configuration of the present embodiment, a single trench gate transistor is constituted by the gate dielectric film 17 formed in the trench 11, the gate electrode 8, and the source 4a and the drain 3 respectively located on both sides thereof. Moreover, another single trench gate transistor is constituted by the gate dielectric film 17 formed in the trench 12, the gate electrode 8, and the drain 3 and the source 4b respectively located on both sides thereof. A plurality of trench gate transistors are aligned in the horizontal (X) direction and the vertical (Y) direction in FIG. 1, thereby constituting a selection transistor portion for DRAM memory cells.

In the configuration of the trench gate transistor, as one example, the gate dielectric film 17 is formed as a silicon oxide film by thermal oxidation, the gate electrode 8 is formed by a polysilicon film, the word line 7 is formed by a metal film, and the LDD side wall 16 is formed by a dielectric film of silicon nitride or the like.

The above-described configuration of the trench gate transistor of the present embodiment, even if microfabricated by shortening the distance between the drain 3 and the source 4a or 4b, can demonstrate an effect of reducing the gate capacitance by providing the thick film part 17b at a portion of the gate dielectric film 17. Since the thick film parts 17b respectively present between: the drain 3 and the gate electrode 8; the source 4a and the gate electrode 8; and the source 4b and the gate electrode 8 do not affect the characteristics of the trench gate transistor, the microfabricated trench gate transistor has a characteristic of ensuring a lower capacitance without affecting the transistor characteristics.

Next, one example of a manufacture method for the trench gate transistor with the configuration of the present invention will be described step by step referring to FIGS. 4 to 11.

Figure 4:
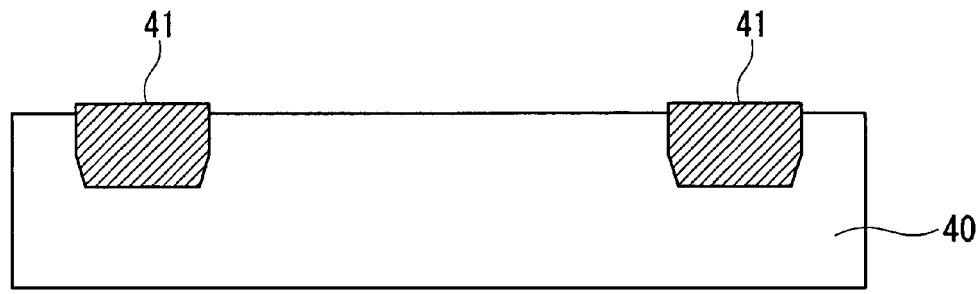
FIG. 4 is a conceptual diagram of the cross section showing a trench isolation dielectric film formed on a semiconductor substrate for explaining a manufacture method for the semiconductor device.

As shown in FIG. 4, a trench isolation dielectric film (element isolation dielectric film) 41 is formed on a silicon substrate 40 by the STI method to insulate and isolate individual active regions. A thermal oxide film is formed on the entire surface of the silicon substrate 40 by thermal oxidation at a temperature of about 750 to 1100 degrees Celsius, and a silicon nitride film (SiN film) is formed on the thermal oxide film by a CVD (Chemical Vapor Deposition) method. The thermal oxide film and the SiN film are patterned to leave a lamination pattern of a dielectric film 42 of the thermal oxide film and an SiN film (nitride film) 43 in a desired region.

Figure 5:
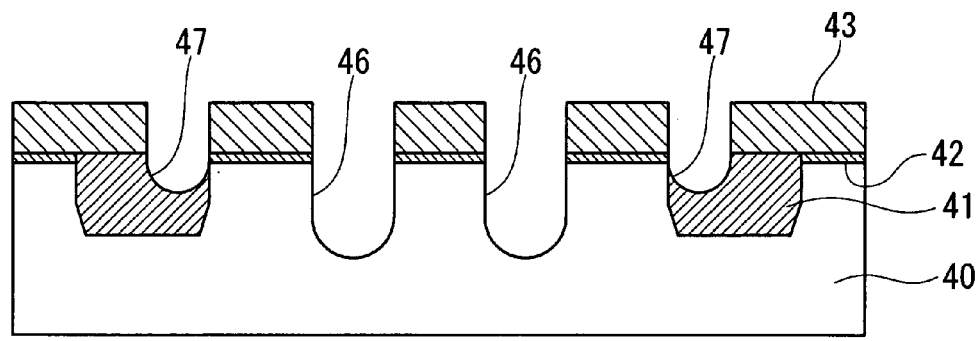
FIG. 5 is a conceptual diagram of the cross section showing a trench formed with an SiN film as a mask for explaining the manufacture method for the semiconductor device.

Next, as shown in FIG. 5, the silicon substrate 40 of the memory cell which is not covered with the thermal oxide film 42 and the SiN film 43 is subjected to anisotropic dry etching to form a trench 46 which becomes a channel region of the trench gate transistor. Trenches 47 are formed in the trench isolation dielectric film 41 on both sides of the trenches 46.

As described above, the trench 46 corresponds to the channel region of the transistor in each of the active regions aligned intermittently, and is formed at a position between the source and drain.

It is desirable to perform high-temperature baking under a hydrogen atmosphere as needed after formation of these trenches.

Figure 10:
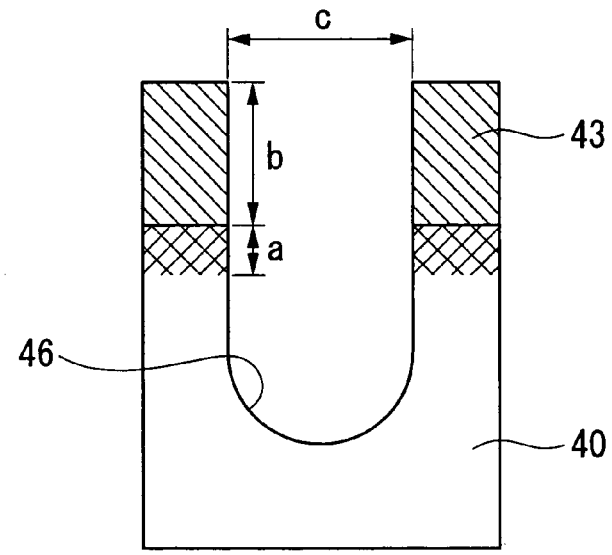
FIG. 10 is a conceptual diagram of the cross section showing the width of the trench, the depth of a source/drain forming region and the thickness of a nitride film for explaining the manufacture method for the semiconductor device.

The cross section of the trench 46 in this state is shown in FIG. 10. In FIG. 10, the depth of a region to be a source region or a drain region in the silicon substrate 40 is defined as "a", the thickness of the SiN film 43 for a mask is defined as "b", and the width of the trench 46 to be a trench gate is defined as "c".

Next, silicon ions are implanted into the trench 46 at a concentration of $5 \times 10^{15}$ to $5 \times 10^{16}$ atoms/cm$^2$ by ion implantation. At this time, the ion implantation is carried out at an ion implantation angle theta to the silicon substrate 40 (incident angle with respect to the depth direction of the trench 46 or the thickness direction of the silicon substrate 40) satisfying the following equation.

$$\tan^{-1}(c/(a+b)) < \theta < \tan^{-1}(c/b)$$

Figure 11:
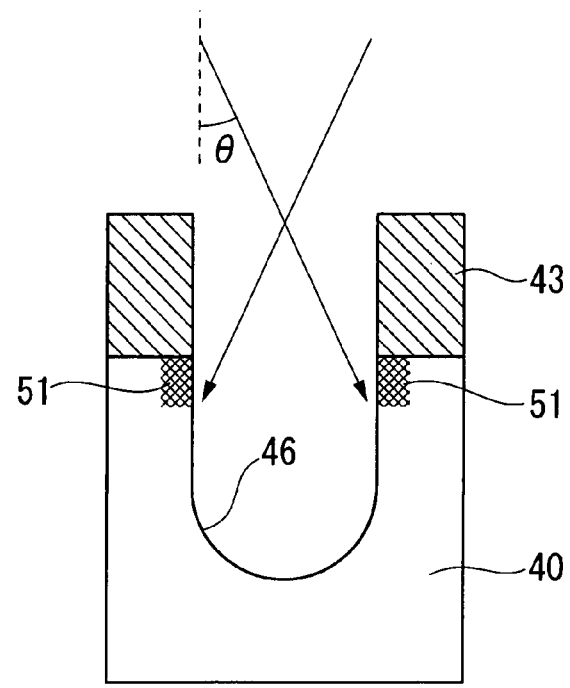
FIG. 11 is a conceptual diagram of the cross section showing an ion incidence angle at the time of implanting ions in the silicon of the trench for explaining the manufacture method for the semiconductor device.

The silicon ion implantation forms an amorphous silicon portion 51 shown in FIG. 11 at the inner peripheral portion of the opening of the trench 46. Because the silicon substrate 40 used in producing such a type of semiconductor is produced by using a wafer cut out from a monocrystalline, the silicon substrate 40 basically comprises a monocrystalline while the region where the silicon ions are implanted at the aforementioned concentration becomes an amorphous region.

To make monocrystalline silicon into amorphous silicon by ion implantation, $1 \times 10^{15}$ atoms/cm$^2$ is normally needed for vertical implantation, but the aforementioned implantation amount is selected in this example in consideration of tilted ion implantation.

Figure 6:
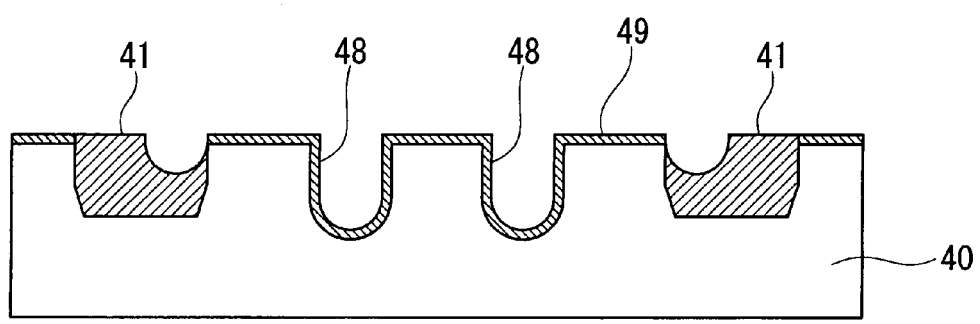
FIG. 6 is a conceptual diagram of the cross section showing a gate dielectric film formed for explaining the manufacture method for the semiconductor device.
Figure 12:
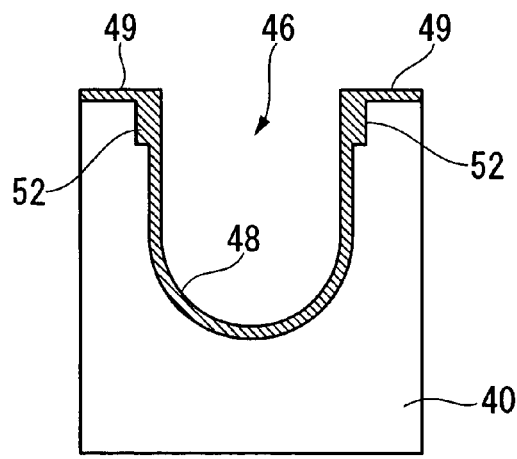
FIG. 12 is a conceptual diagram of the cross section showing the state of a gate dielectric film formed by thermal oxidation after ion implantation for explaining the manufacture method for the semiconductor device.

After a pre-process is performed with an acid solution and a hydrofluoric acid solution, and thermal oxidation is carried out at 700 to 1100 degrees Celsius, thereby forming a gate oxide film (dielectric film) 48 inside the trenches 46 and 47 and on the semiconductor substrate 40, as shown in FIG. 6. In the thermal oxide film forming process, the amorphous region (oxidation accelerating portion) formed by the silicon ion implantation has a faster oxidation rate than silicon in other portions, so that the oxide film is grown thicker. As shown in FIG. 12 in enlargement, therefore, the thin gate dielectric film 48 is formed inside the trench 46, and a thick film part 52 of the gate oxide film is formed at the inner peripheral portion of the opening of the trench 46. A dielectric film 49 is formed on the top surface of the silicon substrate 40 outward of the thick film part 52.

If low-temperature wet oxidation under an atmosphere of $CH_2/O_2$ at 750 degrees Celsius is used at this time, the difference between the oxidation rate of amorphous silicon and that of silicon crystal becomes larger, which is advantageous in forming the thick film part 52. Under the condition, in the case of forming the gate oxide film of 6 nm in thickness in a trench, the gate oxide film with a thickness of 9 nm can be formed in the silicon-implanted amorphous region.

Subsequently, a gate conductive film 44 formed by an impurity-doped silicon film is deposited by the CVD method at a temperature of about 500 to 600 degrees Celsius.

Figure 7:
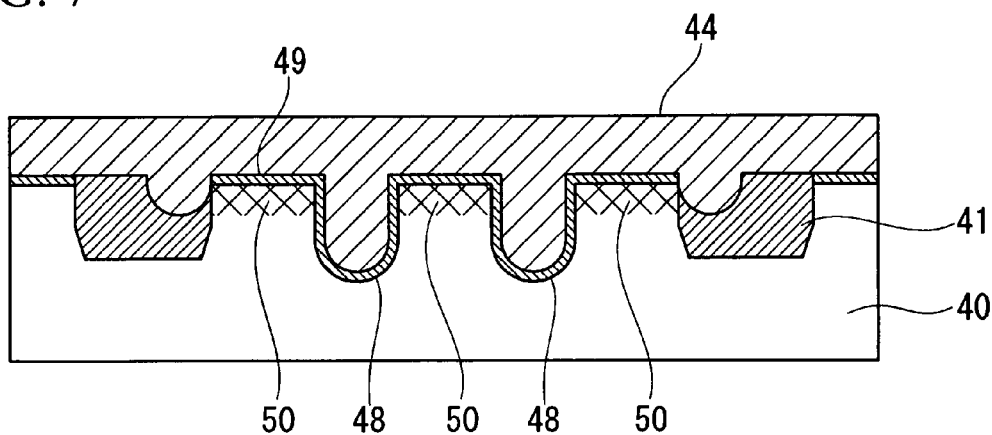
FIG. 7 is a conceptual diagram of the cross section showing the formation of a gate conductive film comprised of an impurity-doped silicon film for explaining the manufacture method for the semiconductor device.

Next, ions of an impurity, such as phosphorous (P), of $1 \times 10^{12}$ to $5 \times 10^{14}$ cm$^2$ are implanted into a desired region for forming the sources and the drain, the resultant structure is annealed at a temperature of 900 to 1100 degrees Celsius to activate the impurity diffusion layer. As a result, an impurity diffusion layer 50 to be a source and a drain can be formed as shown in FIG. 7. The condition can be controlled so that the bottom of the impurity diffusion layer 50 is aligned with the bottom portion of the oxidation accelerating portion.

Figure 8:
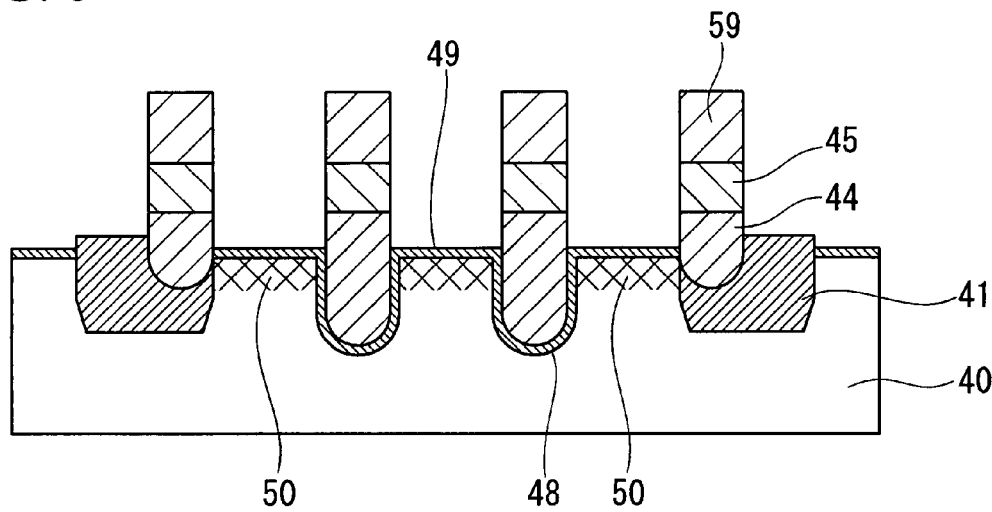
FIG. 8 is a conceptual diagram of the cross section showing a gate conductive film, an interconnection film, and a dielectric-film hard mask laminated for explaining the manufacture method for the semiconductor device.

Next, as shown in FIG. 8, an interconnection film 45 and a dielectric-film hard mask 59 are formed on the gate conductive film 44, a resist pattern is formed on the interconnection film 45 and the dielectric-film hard mask 59, and the dielectric-film hard mask 59, the interconnection film 45, and the gate conductive film 44 are subjected to anisotropic dry etching in order with the resist pattern used as a mask.

Figure 9:
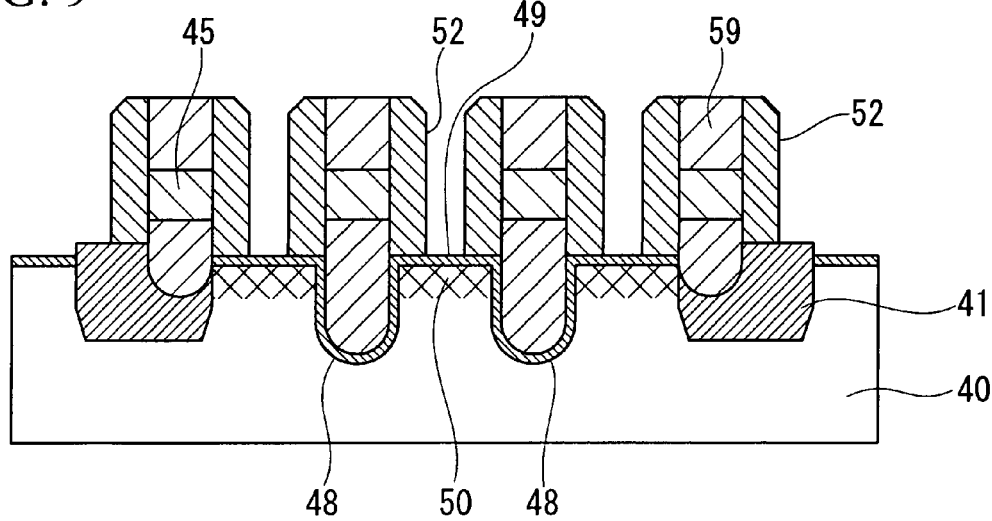
FIG. 9 is a conceptual diagram of the cross section showing side walls formed on the sides of the gate conductive film, the interconnection film, and the dielectric-film hard mask for explaining the manufacture method for the semiconductor device.

Subsequently, LDD side walls 52 comprising an SiN film are formed on sides of the gate electrode as shown in FIG. 9. Then, the dielectric film 49 at the top surface of the silicon substrate which is surrounded by the LDD side walls 52 and the trench isolation dielectric film 41 is partly removed to expose the top surface of the silicon substrate. Then, a conductor portion for contacts is formed in such a way as to be connected to an impurity diffusion layer corresponding to the exposed portion of the top surface of the silicon substrate, thereby forming the semiconductor device H shown in FIG. 2.

Figure 13:
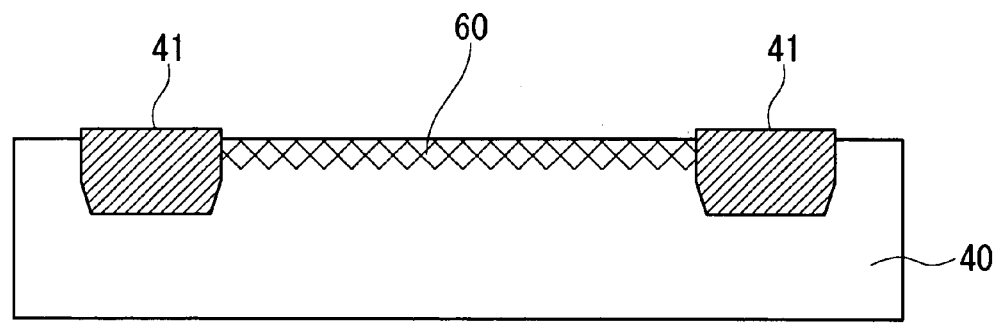
FIG. 13 is a conceptual diagram of the cross section showing a state of a case where ion implantation is carried out after forming a trench isolation dielectric film on a semiconductor substrate for explaining another example of the manufacture method for the semiconductor device.

Instead of the manufacture method of the present embodiment described above, the semiconductor device H may be manufactured by forming the trench isolation dielectric film 41 in the silicon substrate 40 by the STI method, then forming a low-concentration impurity diffusion layer 60 to be a source and a drain in a necessary region as shown in FIG. 13, followed by the processes starting with the one in FIG. 5.

Figure 14:
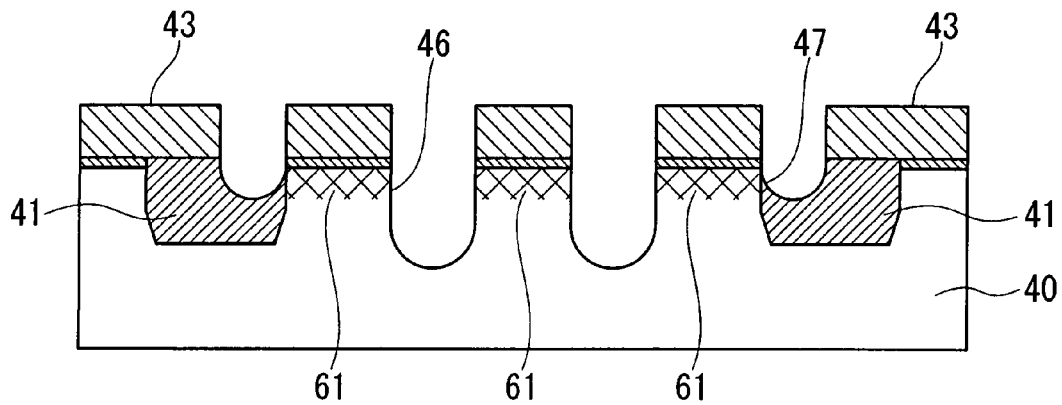
FIG. 14 is a conceptual diagram of the cross section showing a source/drain region formed after forming a trench by etching with a nitride film used as a mask for explaining the manufacture method for the semiconductor device.
Figure 15:
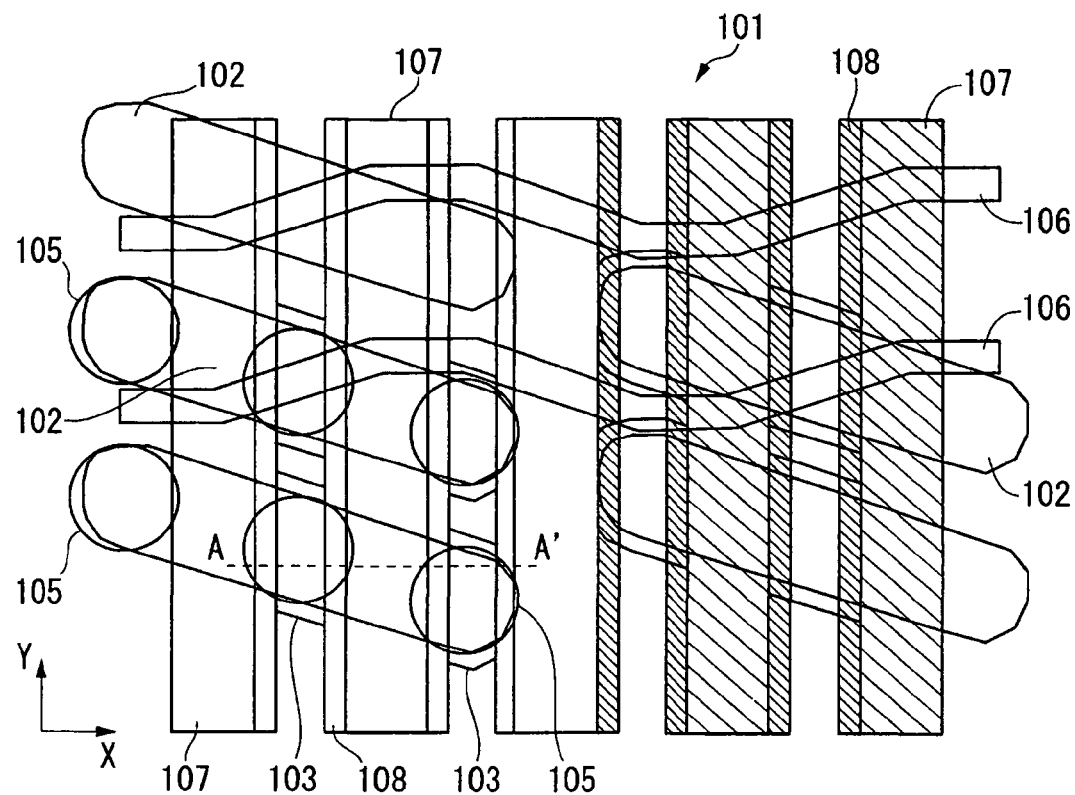
FIG. 15 is a conceptual diagram showing one example of the planar structure of a conventional trench gate transistor.
Figure 16:
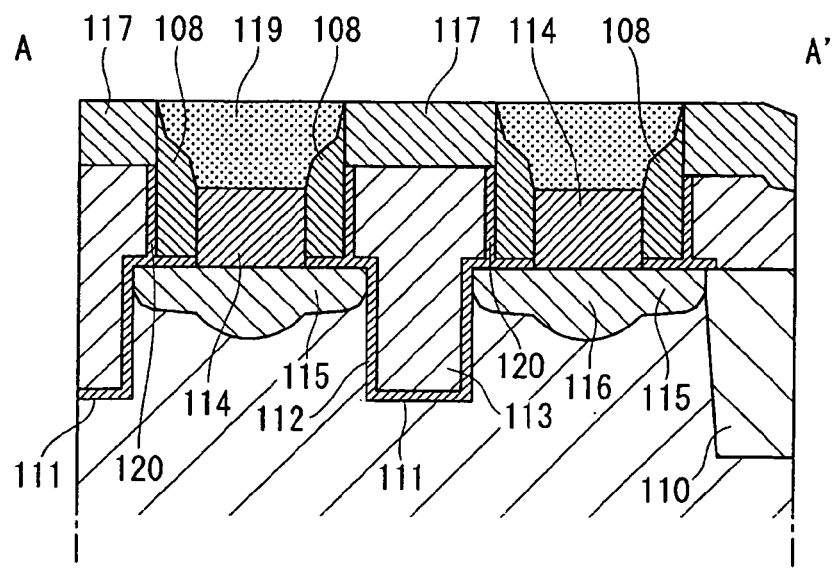
FIG. 16 is a conceptual diagram of the cross section of the structure shown in FIG. 15 along line A-A'.

Alternatively, the semiconductor device H may be manufactured by forming the trenches 46 as shown in FIG. 5, then forming a low-concentration impurity diffusion layer 61 to be a source and a drain in a necessary region as shown in FIG. 14, followed by the processes starting with the one in FIG. 6.

Although the foregoing description has been given of a method of forming the thick film part of the oxide film by making the trench side wall portions of the region, where the source and drain diffusion layers are formed, amorphous silicon by using tilted silicon implantation, the thick film part of the oxide film may alternatively be formed by selective oxidation by implanting an impurity of the same conductivity type as that of the impurity for forming the source and drain.

Although silicon is used as an ion seed in the foregoing embodiment, phosphorous for forming the source and drain may be implanted instead of silicon at a concentration of $5 \times 10^{15}$ to $5 \times 10^{16}$ atoms/cm$^2$.

The condition for the ion implantation angle theta is the same as that of the foregoing embodiment. The phosphorous concentration per unit volume of the implantation region is set to $5 \times 10^{20}$ to $1 \times 10^{21}$ atoms/cm$^3$. Gate oxidation is achieved by $H_2/O_2$ wet oxidation at 750 degrees Celsius as in the case of silicon implantation. As phosphorous has an accelerating oxidation characteristic, oxidation can be increased by 2 to 2.5 times as fast as can be achieved by silicon in the region where phosphorous is not implanted. In a case where the gate oxide film of 6 nm in thickness is formed in a trench, therefore, an oxide film having a thickness of 12 to 15 nm can be formed in the phosphorous-implanted region which contacts the source and the drain.

Phosphorous is the same as the impurity for forming the source and drain, and does not therefore adversely affect the formation of the source and drain.

While preferred embodiments of the present invention have been described and illustrated above, it should be understood that these are exemplary of the present invention and are not to be considered as limiting. Additions, omissions, substitutions, and other modifications can be made without departing from the gist or scope of the present invention. Accordingly, the present invention is not to be considered as being limited by the foregoing description, and is only limited by the scope of the appended claims.

What is claimed is:

1. A method of manufacturing a semiconductor device comprising:
    forming an element isolation dielectric film in a semiconductor substrate;
    forming a dielectric film and a nitride film on the semiconductor substrate in which the element isolation dielectric film is formed;
    forming a trench with vertical sides in the semiconductor substrate with the nitride film used as a mask;
    forming an oxidation accelerating portion by implanting ions in a surface portion of the semiconductor substrate at a periphery of the trench;
    forming a gate oxide film inside the trench by oxidizing a region of the semiconductor substrate inside the trench by oxidation, and forming a thick film part, which is thicker than the gate oxide film inside the trench, at the oxidation accelerating portion;
    forming a gate electrode in another trench inward of the gate oxide film; and
    forming a source and a drain by implanting ions in the semiconductor substrate adjacent to the gate electrode.

2. The method as recited in claim 1, wherein at the time of implanting the ions in the surface portion of the semiconductor substrate at the periphery of the trench, the ions are implanted in a tilted manner with respect to the depth direction of the trench, and the oxidation accelerating portion is formed in the surface portion of the semiconductor substrate at a periphery of an inlet portion of the trench.

3. The method as recited in claim 1, wherein the oxidation accelerating portion forms a part of the source and the drain.

4. The method as recited in claim 1, wherein implantation of the ions into the surface portion of the semiconductor substrate at the periphery of the trench turns an ion-implanted portion into amorphous silicon.

5. The method as recited in claim 1, wherein the ions to be implanted to form the oxidation accelerating portion have the same conductivity type as that of the ions for forming the source and the drain.

6. The method as recited in claim 1, wherein an amount of implantation of the ions to be implanted into the surface portion of the semiconductor substrate at the periphery of the trench is set to $5 \times 10^{15}$ to $5 \times 10^{16}$ atoms/cm$^2$.

7. The method as recited in claim 1, wherein the ions to be implanted to form the oxidation accelerating portion have an accelerating oxidation characteristic.

8. The method as recited in claim 6, wherein the ion implantation angle at the time of implanting the ions is defined as a tilt angle theta with respect to the depth direction of the trench, and the tilt angle theta is set to the range of $\tan^{-1}\{c/(a+b)\} < \text{theta} < \tan^{-1}(c/b)$ where a is the depth of a region to be the source and the drain, b is the thickness of the nitride film, and c is the width of the trench.

* * * * *